(12) United States Patent
Ikagawa

(10) Patent No.: US 10,325,863 B2
(45) Date of Patent: Jun. 18, 2019

(54) SEMICONDUCTOR DEVICE AND METHOD FOR MANUFACTURING SAME

(71) Applicant: Kabushiki Kaisha Toshiba, Minato-ku (JP)

(72) Inventor: Masakuni Ikagawa, Ebina (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/897,267

(22) Filed: Feb. 15, 2018

(65) Prior Publication Data

US 2018/0247899 A1    Aug. 30, 2018

(30) Foreign Application Priority Data

Feb. 28, 2017 (JP) .................. 2017-037110
Jan. 31, 2018 (JP) .................. 2018-015405

(51) Int. Cl.
| | |
|---|---|
| H01L 23/48 | (2006.01) |
| H01L 23/00 | (2006.01) |
| H01L 23/532 | (2006.01) |
| H01L 23/535 | (2006.01) |
| H01L 21/02 | (2006.01) |
| H01L 21/768 | (2006.01) |
| C09D 183/04 | (2006.01) |
| C09D 7/61 | (2018.01) |
| C09D 7/40 | (2018.01) |
| C09D 183/16 | (2006.01) |
| C08K 3/36 | (2006.01) |

(52) U.S. Cl.
CPC ............. *H01L 23/562* (2013.01); *C09D 7/61* (2018.01); *C09D 7/67* (2018.01); *C09D 183/04* (2013.01); *C09D 183/16* (2013.01); *H01L 21/02118* (2013.01); *H01L 21/02282* (2013.01); *H01L 21/02318* (2013.01); *H01L 21/76805* (2013.01); *H01L 21/76895* (2013.01); *H01L 23/535* (2013.01); *H01L 23/5329* (2013.01); *H01L 23/53257* (2013.01); *C08K 3/36* (2013.01)

(58) Field of Classification Search
CPC .. H01L 23/562; H01L 23/535; H01L 23/5329
USPC ....................................................... 257/783
See application file for complete search history.

(56) References Cited

U.S. PATENT DOCUMENTS

| 6,056,846 A * | 5/2000 | Kuhl | ............ B29C 70/08 |
| | | | 156/278 |
| 6,171,979 B1 * | 1/2001 | Aoi | ............ H01L 21/76807 |
| | | | 438/778 |

(Continued)

FOREIGN PATENT DOCUMENTS

| JP | 2007-158085 | 6/2007 |
| JP | 2012-520912 | 9/2012 |

(Continued)

*Primary Examiner* — Nitin Parekh
(74) *Attorney, Agent, or Firm* — Oblon, McClelland, Maier & Neustadt, L.L.P.

(57) ABSTRACT

According to one embodiment, a semiconductor device includes an insulating film. The insulating film includes a first insulating particle, and a second insulating particle. A particle size of at least one of the first insulating particle or the second insulating particle exceeds 0 nm and being not more than 30 nm. An average size of a void between the first insulating particle and the second insulating particle exceeds 0 nm and being not more than 10 nm.

12 Claims, 7 Drawing Sheets

(56) References Cited

U.S. PATENT DOCUMENTS

| | | | | |
|---|---|---|---|---|
| 6,423,172 B1* | 7/2002 | McArdle | ............... | B05D 3/207 |
| | | | | 156/272.2 |
| 6,472,758 B1* | 10/2002 | Glenn | ................ | H01L 25/0657 |
| | | | | 257/777 |
| 6,784,555 B2* | 8/2004 | Watson | ..................... | C09J 5/06 |
| | | | | 156/329 |
| 7,262,477 B2* | 8/2007 | Okumura | ............. | H01L 21/316 |
| | | | | 257/510 |
| 7,439,475 B2* | 10/2008 | Ohta | .................... | H01L 23/373 |
| | | | | 219/552 |
| 8,513,816 B2* | 8/2013 | Takamoto | ............... | C08K 3/22 |
| | | | | 257/778 |
| 8,841,776 B2* | 9/2014 | Nishimura | ......... | H01L 21/6836 |
| | | | | 257/724 |
| 2003/0031789 A1* | 2/2003 | Bedwell | ............... | C08G 77/04 |
| | | | | 427/248.1 |
| 2003/0042615 A1* | 3/2003 | Jiang | ..................... | H01L 24/32 |
| | | | | 257/777 |
| 2004/0224481 A1* | 11/2004 | Tomimatsu | ............ | H01L 24/29 |
| | | | | 438/455 |
| 2010/0288963 A1 | 11/2010 | Mitina et al. | | |
| 2012/0193596 A1 | 8/2012 | Nakazawa | | |
| 2014/0346436 A1 | 11/2014 | Li et al. | | |
| 2014/0346684 A1* | 11/2014 | Kojima | .................. | H01L 24/32 |
| | | | | 257/783 |

FOREIGN PATENT DOCUMENTS

| | | |
|---|---|---|
| JP | 2013-104029 | 5/2013 |
| JP | 5606347 | 10/2014 |
| JP | 2016-526076 | 9/2016 |

* cited by examiner

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No.2017-037110, filed on Feb. 28, 2017, and Japanese Patent Application No.2018-015405, filed on Jan. 31, 2018; the entire contents of all of which are incorporated herein by reference.

FIELD

Embodiments described herein relate generally to a semiconductor device and a method for manufacturing a semiconductor device.

BACKGROUND

Not only thin insulating films but also thick insulating films that are, for example, 4.0 μm to 7.0 μm or more are used in a semiconductor device. A semiconductor device that includes a practical insulating film in which cracks do not occur easily is desirable even in the case where the insulating film is formed to be thick.

DETAILED DESCRIPTION

Figure 1:
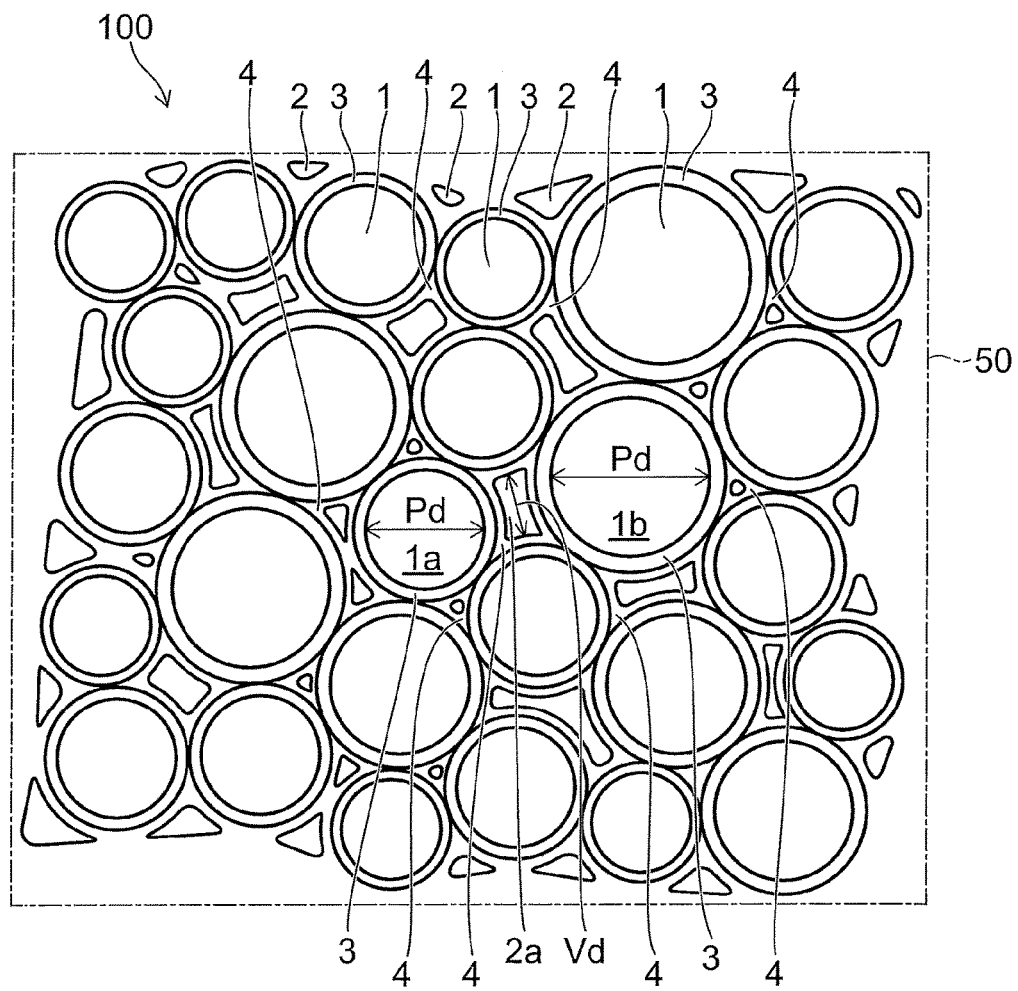
FIG. 1 is a schematic cross-sectional view illustrating an insulating film included in a semiconductor device according to an embodiment.

According to one embodiment, a semiconductor device includes an insulating film. The insulating film includes a first insulating particle, and a second insulating particle. A particle size of at least one of the first insulating particle or the second insulating particle exceeds 0 nm and being not more than 30 nm. An average size of a void between the first insulating particle and the second insulating particle exceeds 0 nm and being not more than 10 nm.

Hereinafter, embodiments will be described with reference to the drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

[Embodiment]

Figure 2:
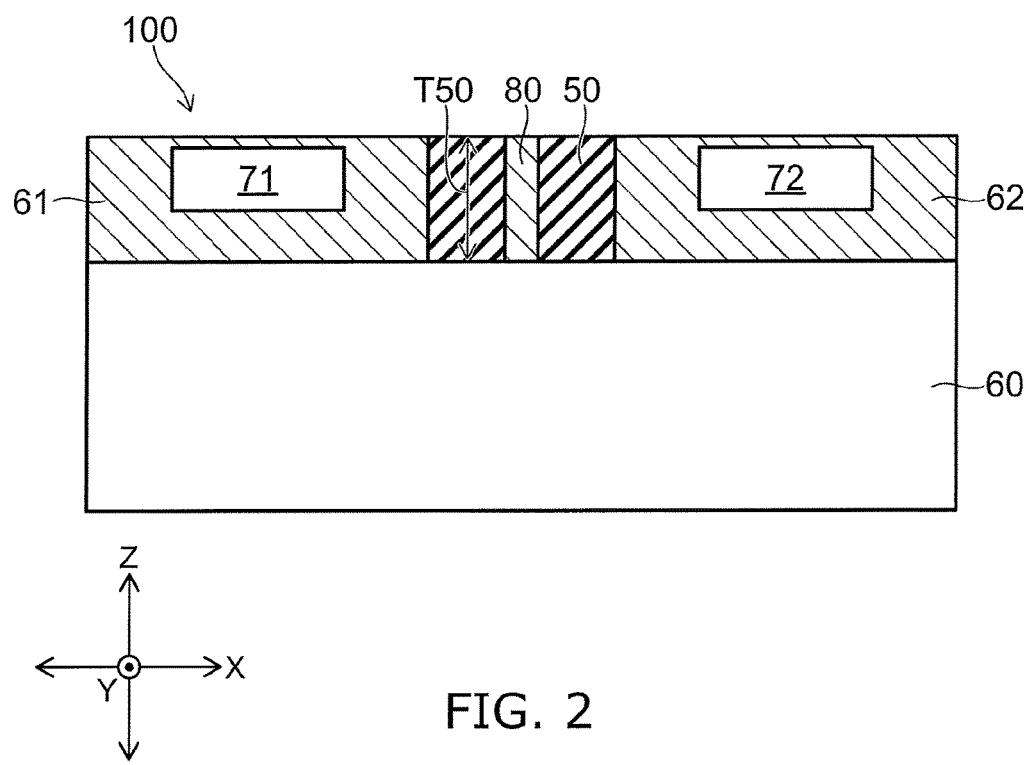
FIG. 2 is a schematic cross-sectional view illustrating the semiconductor device according to the embodiment.

FIG. 1 is a schematic cross-sectional view illustrating an insulating film included in a semiconductor device according to an embodiment. FIG. 2 is a schematic cross-sectional view illustrating the semiconductor device according to the embodiment. A first direction, a second direction, and a third direction are shown in FIG. 2. In the specification, the first direction is taken as an X-axis direction. One direction crossing, e.g., orthogonal to, the X-axis direction is taken as a second direction. The second direction is a Z-axis direction. One direction crossing, e.g., orthogonal to the X-axis direction and the Z-axis direction is taken as a third direction. The third direction is a Y-axis direction.

As shown in FIG. 1 and FIG. 2, the semiconductor device 100 according to the embodiment includes an insulating film 50. The insulating film 50 includes multiple insulating particles 1, e.g., a first insulating particle 1a and a second insulating particle 1b. At least one of a particle size Pd of the first insulating particle 1a or the particle size Pd of the second insulating particle 1b exceeds 0 nm and is not more than 30 nm. In the embodiment, the average particle size of the insulating particles 1 is about 15 nm. A void 2 exists between the insulating particles 1. For example, a void 2a exists between the first insulating particle 1a and the second insulating particle 1b. One diameter Vd of the void 2a exceeds 0 nm and is not more than 10 nm. In the embodiment, the average size of the voids 2 exceeds 0 nm and is not more than 10 nm. For example, the average size of the voids 2a between the first insulating particle 1a and the second insulating particle 1b exceeds 0 nm and is not more than 10 nm.

In the embodiment, the insulating particles 1, e.g., the first insulating particle 1a and the second insulating particle 1b, are inorganic insulating particles. The inorganic insulating particle includes, for example, silicon oxide. In the embodiment, the silicon oxide is, for example, silica ($SiO_2$).

In the embodiment, a first film 3 is further included at the surface of the insulating particle 1. The first film 3 includes, for example, an organic-inorganic hybrid polymer. The organic-inorganic hybrid polymer includes, for example, polysiloxane.

In the embodiment, a second film 4 is further included between the insulating particles 1. For example, the void 2 and the void 2a exist inside the second film 4. The second film 4 includes, for example, a siloxane bond. The siloxane bond includes, for example, a cyclosiloxane bond.

As shown in FIG. 2, the semiconductor device 100 includes a base body 60. The base body 60 includes, for example, a semiconductor layer. The semiconductor layer is, for example, silicon. A first portion 61 and a second portion 62 are provided on the base body 60. The first portion 61 and the second portion 62 each include an insulating layer, a semiconductor layer, and a conductive layer. The insulating layer includes, for example, silicon oxide, silicon nitride, aluminum oxide, etc. The semiconductor layer includes, for example, silicon. The conductive layer includes, for example, tungsten. The insulating layer, the semiconductor layer, and the conductive layer are not illustrated in FIG. 2.

The first portion 61 includes a first semiconductor element 71. The second portion 62 includes a second semiconductor element 72. The second semiconductor element 72 is separated from the first semiconductor element 71 in the X-axis direction. The first semiconductor element 71 and the second semiconductor element 72 include, for example, transistors.

The insulating film 50 is provided between the first portion 61 and the second portion 62. A thickness T50 of the insulating film 50 in the Z-axis direction is, for example, not less than 4 µm and not more than 7 µm. A conductive body 80 is provided in the insulating film 50. The conductive body 80 extends in the Z-axis direction. The conductive body 80 is an internal interconnect of the semiconductor device 100. The conductive body 80 includes, for example, tungsten.

Figure 5A:
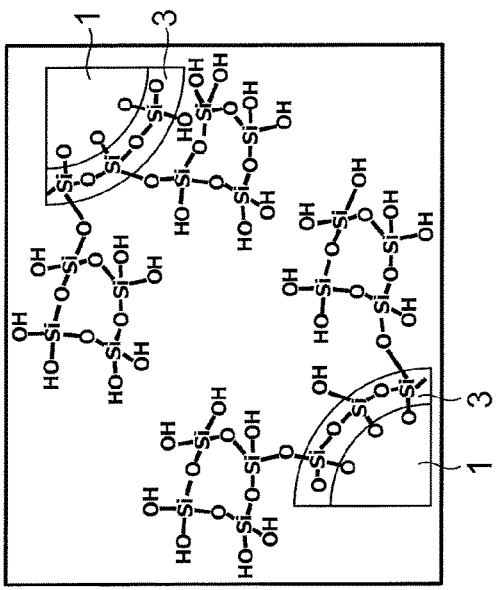
FIG. 5A to FIG. 5D are schematic views illustrating reaction steps of the method for manufacturing the semiconductor device according to the embodiment.
Figure 5C:
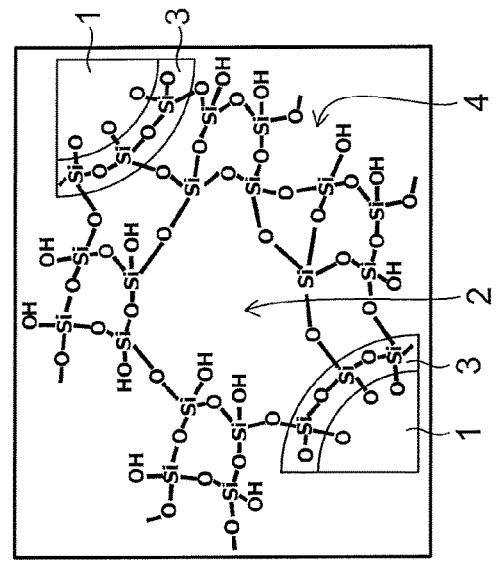
Figure 5B:
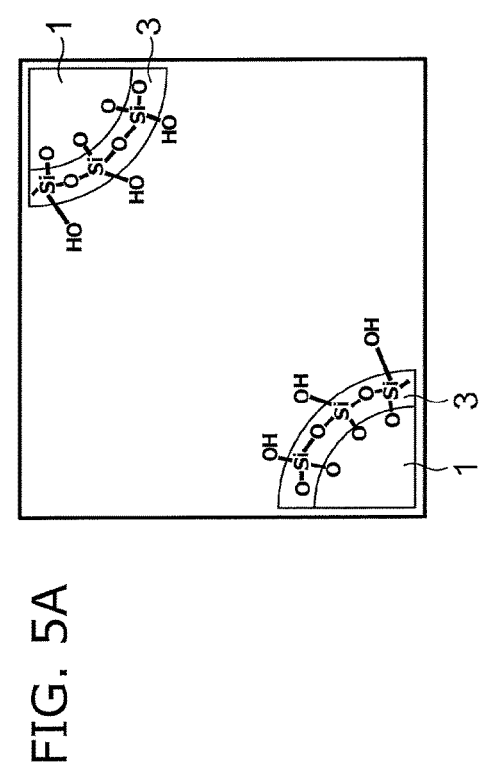
Figure 5D:
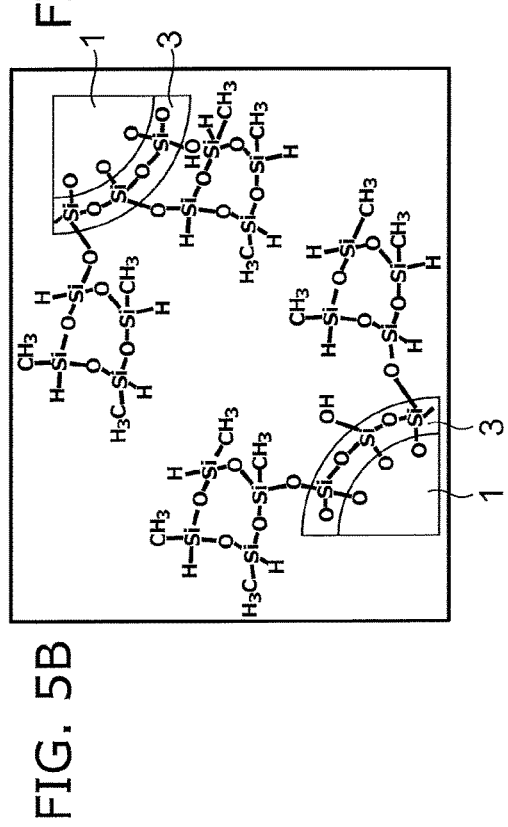
Figure 6A:
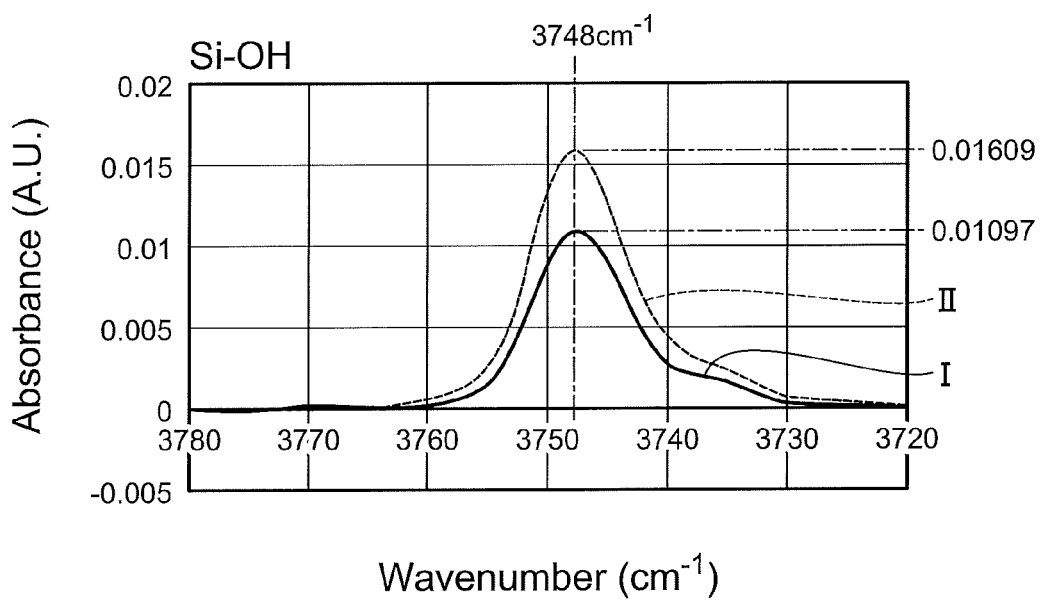
FIG. 6A and FIG. 6B are figures showing analysis results using FT-IR.
Figure 6B:
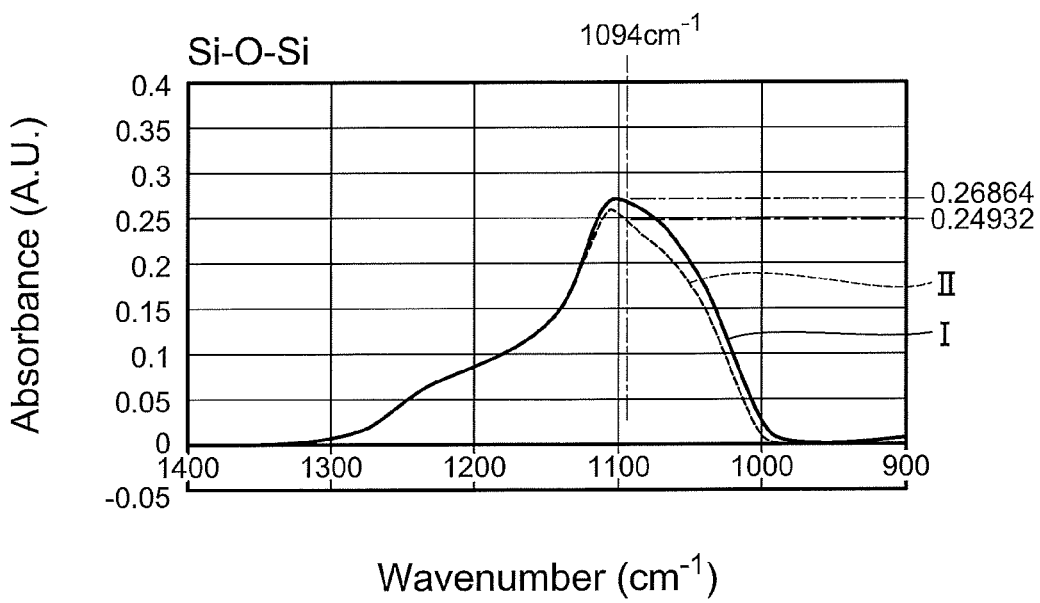

FIG. 3A to FIG. 3H are schematic cross-sectional views illustrating a method for manufacturing the semiconductor device according to the embodiment. FIG. 4 is a flowchart illustrating the method for manufacturing the semiconductor device according to the embodiment. FIG. 5A to FIG. 5D are schematic views illustrating the reaction steps of the method for manufacturing the semiconductor device according to the embodiment. FIG. 6A and FIG. 6B are figures showing analysis results using FT-IR.

Figure 3A:
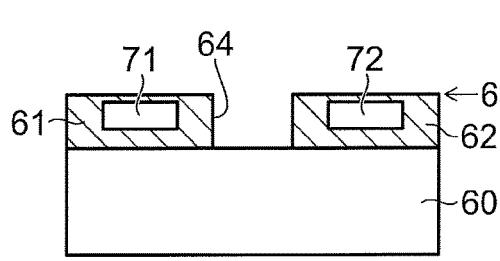
FIG. 3A to FIG. 3H are schematic cross-sectional views illustrating a method for manufacturing the semiconductor device according to the embodiment.
Figure 3E:
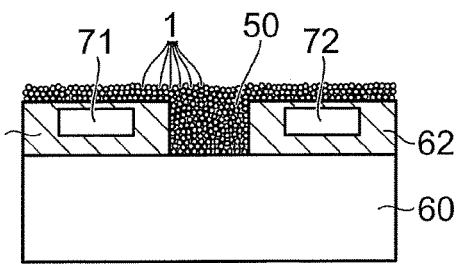
Figure 3B:
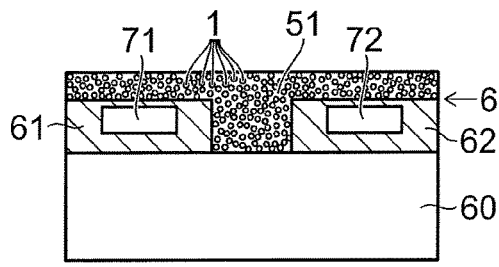
Figure 4:
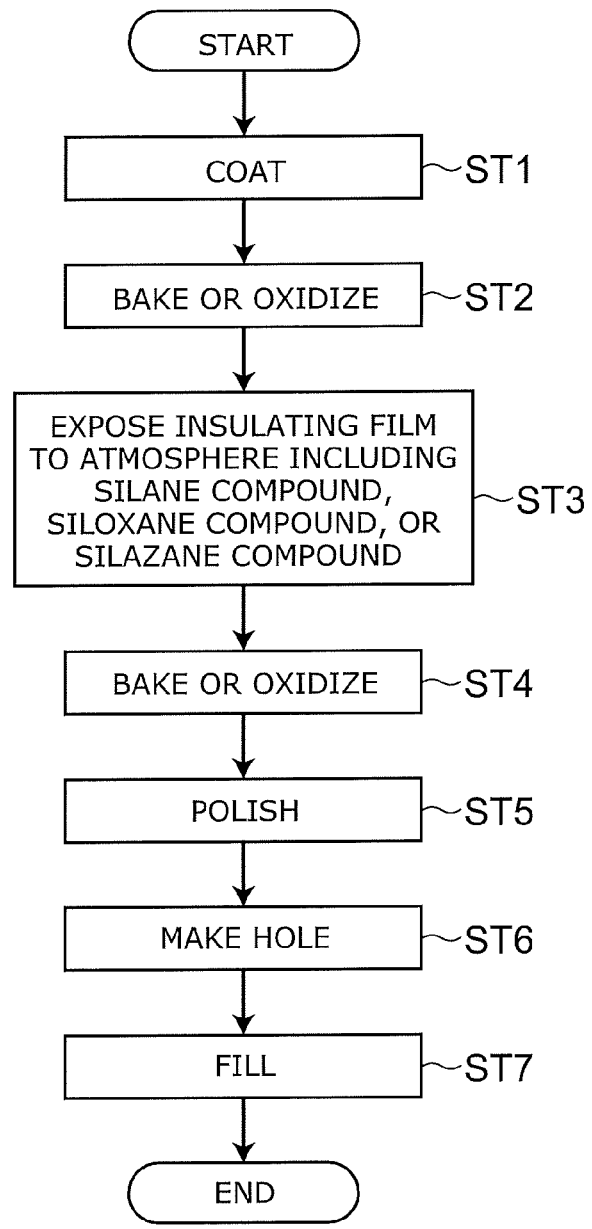
FIG. 4 is a flowchart illustrating the method for manufacturing the semiconductor device according to the embodiment.

As shown in step ST1 in FIG. 3A, FIG. 3B, and FIG. 4, a coated film 51 is formed by coating a fluid including the insulating particles 1 having particle sizes exceeding 0 nm and being not more than 30 nm onto a first surface 63 of the base body 60 including the semiconductor layer. The insulating particles 1 are the insulating particles 1 shown in FIG. 1. The insulating particles 1 are, for example, inorganic insulating particles and include, for example, silicon oxide. In the case where the insulating particle 1 is an inorganic insulating particle, the first film 3 that includes the organic-inorganic hybrid polymer shown in FIG. 1 may be included at the surface of the insulating particle 1. The organic-inorganic hybrid polymer includes, for example, polysiloxane.

Figure 3F:
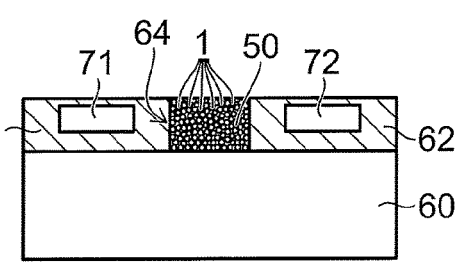
Figure 3C:
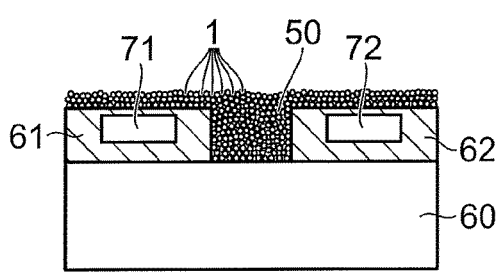

Then, as shown in step ST2 in FIG. 3C and FIG. 4, the insulating film 50 is formed by baking the coated film 51. The baking temperature of step ST2 is, for example, 800° C. The baking time is, for example, 30 s. As shown in FIG. 5A, the first film 3 is terminated with, for example, an OH group.

In step ST2, the insulating film 50 may be oxidation-reformed in a water vapor or an oxygen atmosphere in which an oxidative active species are produced. The oxidation reforming process includes, for example, a plasma process (MBP: Microwave excited Bubble Plasma in water), an ozone gas process, or UV irradiation process.

Figure 3G:
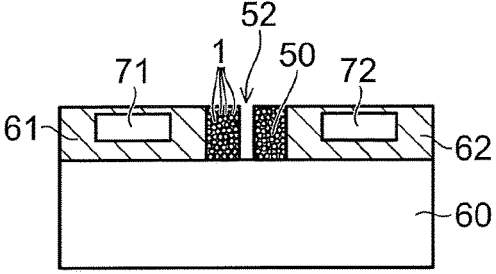
Figure 3D:
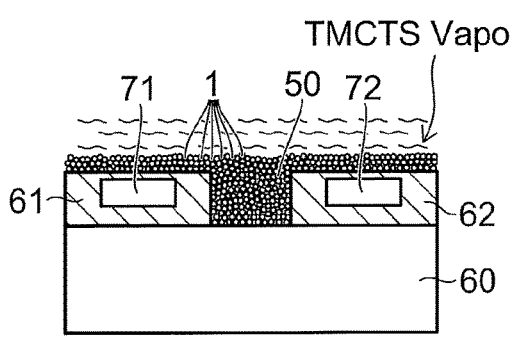

Then, as shown in step ST3 in FIG. 3D and FIG. 4, the insulating film 50 is exposed to an atmosphere including a siloxane compound. The siloxane compound includes at least a Si—R1 bond and a Si—R2 bond. For example, "R1" and "R2" each are substituents. The substituent R1 includes at least one substituent selected from the group consisting of hydrogen, an alkyl group, and an alkylene group. The substituent R2 includes at least one substituent selected from the group consisting of hydrogen, an alkyl group, and an alkylene group. In the embodiment, the siloxane compound is a cyclosiloxane compound. The cyclosiloxane compound is, for example, tetramethylcyclotetrasiloxane (TMCTS). For example, TMCTS includes four hydrogens as the substituent R1. Four methyl groups are included as the substituent R2.

In the embodiment, the insulating film 50 is exposed to TMCTS vapor. The TMCTS vapor includes, for example, water vapor. As shown in FIG. 5B, the Si—OH of the first film 3 reacts with the TMCTS in the atmosphere. Hydrogen (H) desorbs from the Si—OH of the first film 3 and the TMCTS in the atmosphere. Dangling bonds of the first film 3 and dangling bonds of the TMCTS bond to each other. The TMCTS is bonded to the first film 3.

Then, as shown in step ST4 in FIG. 3E and FIG. 4, for example, the insulating film 50 having been exposed to the TMCTS vapor is baked. The baking temperature in step ST4 is, for example, 800° C. to 1000° C. The baking time is 10 s to 30 s. The atmosphere is ambient air. Ambient air includes, for example, water vapor and/or ozone. As shown in FIG. 5C, H and $CH_3$ desorb from the TMCTS. The Si—H and the Si—$CH_3$ of the TMCTS change into Si—OH. Further, as shown in FIG. 5D, a condensation reaction (dehydrating condensation) of the Si—OH occurs. The Si—OH changes into Si—O—Si. The second film 4 that includes siloxane bonds (Si—O—Si) is formed between the insulating particles 1. In step ST4, the oxidation reforming process similar to the above step ST2 may be performed to the insulating film 50.

The analysis results of FT-IR of the Si—OH of the first film 3 and/or the second film 4 are shown in FIG. 6A. The analysis results of FT-IR of the Si—O—Si of the first film 3 and the second film 4 are shown in FIG. 6B. In FIG. 6A and FIG. 6B, the horizontal axis is the wave number; and the vertical axis is the absorbance. The analysis result of the embodiment (the solid line I) and the analysis result of a reference example (the broken line II) are shown in FIG. 6A and FIG. 6B.

A specific example is as follows:
Embodiment (solid line I):
  Step ST2: 800° C. for 30 s
  Step ST3: TMCTS vapor
  Step ST4: 800° C. for 30 s
  In the embodiment, the resistance to the chemical liquid, e.g., DHF (one etchant) reaches the necessary level. Both the first film 3 and the second film 4 exist in the embodiment.
Reference example (broken line II):
  Step ST2: 800° C. for 30 s
  Step ST3 and step ST4 are not performed.
  In the reference example, for example, the resistance to DHF does not reach the necessary level. In the reference example, the first film 3 exists; but the second film 4 does not exist.

As shown in FIG. 6A, Si—OH exhibits a stretching vibration in the first film 3 and/or the second film 4. A peak of the stretching vibration appears when the wave number is, for example, 3748 $cm^{-1}$.

In the case of the embodiment as shown by solid line I, the absorbance at the wave number of 3748 $cm^{-1}$ (the peak height of the stretching vibration) is about 0.01097.

In the case of the reference example as shown by broken line II, the absorbance at the wave number of 3748 $cm^{-1}$ (the peak height of the stretching vibration) is about 0.01609.

As shown in FIG. 6B, the Si—O—Si exhibits stretching vibration similarly to the Si—OH in the first film 3 and/or the second film 4. However, while the stretching vibration of the Si—OH is "symmetric;" the stretching vibration of the Si—O—Si is "asymmetric." It is assumed that the peak of the stretching vibration of the Si—O—Si appears when the wave number is, for example, 1094 $cm^{-1}$. The wave number of 1094 $cm^{-1}$ is the vibration peak of the Si—O—Si in the silicon thermal oxide film (Th—Ox). The waveform of the silicon thermal oxide film is not illustrated in FIG. 6B.

In the case of the embodiment as shown by solid line I, the absorbance at the wave number of 1094 $cm^{-1}$ (the peak height of the stretching vibration) is about 0.26864.

In the case of the reference example as shown by broken line II, the absorbance at the wave number of 1094 $cm^{-1}$ (the peak height of the stretching vibration) is about 0.24932.

In the case of the embodiment, the ratio "Si—OH/Si—O—Si" of the peak height of the stretching vibration of the Si—OH to the peak height of the stretching vibration of the Si—O—Si is 4.1%. The ratio "Si—OH/Si—O—Si" is, for example, 5% or less.

In the case of the reference example, the ratio "Si—OH/Si—O—Si" of the stretching vibration peak height of the Si—OH to the peak height of the stretching vibration of the Si—O—Si is 6.5%. The ratio "Si—OH/Si—O—Si" exceeds 5%.

From such analysis results, the insulating film 50 that includes the first film 3 and the second film 4 may have the following relationship in order to suppress the wettability and/or the reactivity for chemical liquids and to improve the resistance to chemical liquids.

For example, for the insulating film 50 that includes the first film 3 and the second film 4, for example, it is desirable for the ratio of the stretching vibration peak height of the Si—OH in FT-IR analysis to the Si—O—Si stretching vibration peak height in the FT-IR analysis to be 0% or more, and be not more than 5%.

In the embodiment as shown in FIG. 5D, the siloxane bond includes, for example, a cyclosiloxane bond. The second film 4 includes, for example, the void 2. The average size of the voids 2 exceeds 0 nm and is not more than 10 nm. For example, the average size of the voids 2 may be adjusted to exceed 0 nm and be not more than 10 nm by multiply repeating the TMCTS vapor processing (step ST3) and the baking (step ST4).

For example, the film formation of the insulating film 50 ends in the steps up to step ST4 in FIG. 3E and FIG. 4. Subsequently, patterning of the insulating film 50 is performed, for example, as recited below.

Then, as shown in step ST5 in FIG. 3F and FIG. 4, the baked insulating film 50 is polished and planarized. The polishing is, for example, chemical mechanical polishing (CMP). For example, the planarized insulating film 50 fills a gap 64 occurring between the first portion 61 and the second portion 62.

Figure 3H:
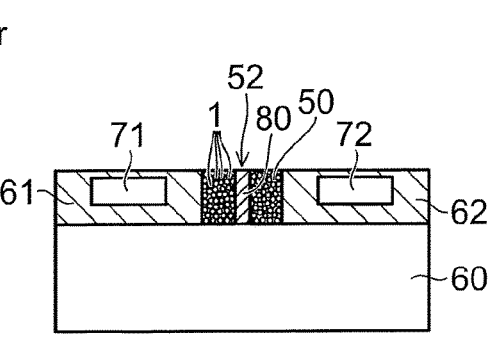

Then, as shown in step ST6 in FIG. 3G and FIG. 4, baking is performed; and a hole 52 is formed (made) in the planarized insulating film 50. Then, as shown in FIG. 3H, the conductive body 80 is formed (filled) in the hole 52. Thus, for example, the semiconductor device according to the embodiment is manufactured.

Figure 7:
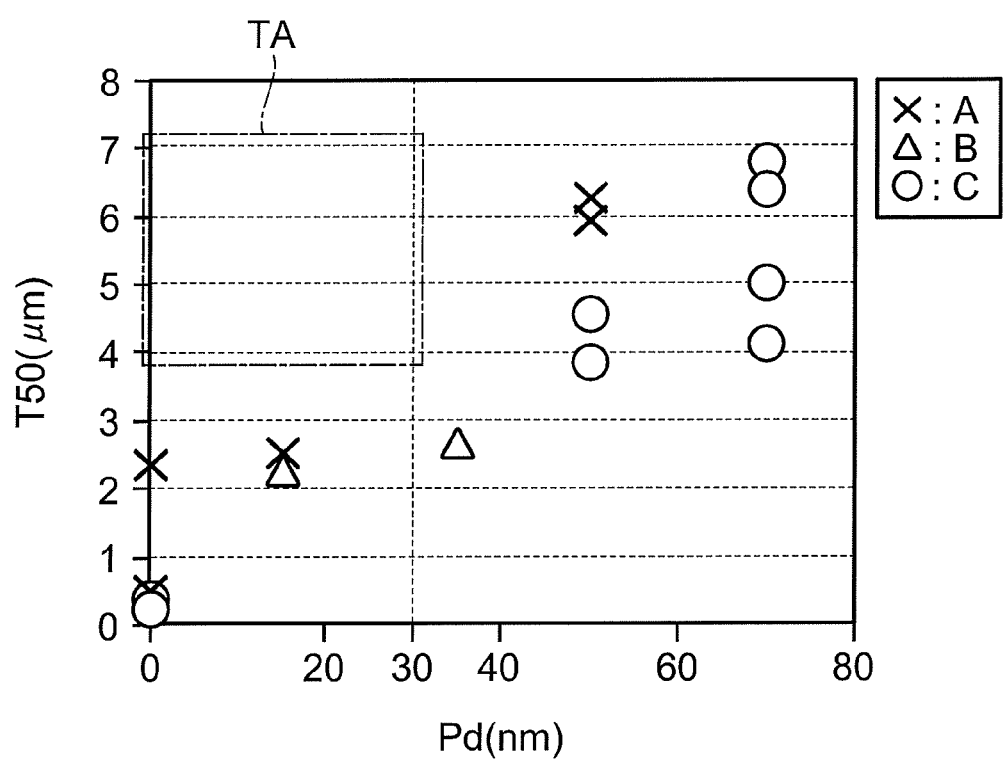
FIG. 7 is a figure showing a relationship between a particle size Pd and a thickness T50 of an insulating film 50 in a Z-axis direction.

FIG. 7 is a figure showing the relationship between the particle size Pd and the thickness T50 of the insulating film 50 in the Z-axis direction. The occurrence condition of the cracks is shown in FIG. 7. In FIG. 7, "A" shows that cracks exist in the entirety; "B" shows that cracks exist in the surface layer; and "C" shows that cracks do not exist.

1. The case where the insulating particles 1 are included:
   When the particle size Pd is 70 nm or more, cracks do not occur even when the thickness T50 reaches about 7 μm.
   Cracks occur when the thickness T50 exceeds about 5 μm and the particle size Pd is 40 nm to 60 nm, e.g., about 50 nm.
   Cracks occur in the surface layer when the thickness T50 exceeds about 2.5 μm and the particle size Pd is 20 nm to 40 nm, e.g., about 35 nm.
   Cracks occur in the entirety when the thickness T50 exceeds about 2.5 μm and the particle size Pd is 10 nm to 20 nm, e.g., about 15 nm.
2. The case where the insulating particles 1 are not included:
   Cracks do not occur when the particle size Pd is 0 nm and the thickness T50 is about 0.5 μm or less; but cracks occur in the entire insulating film 50 when the thickness T50 exceeds about 0.5 μm.

As shown in FIG. 7, in the case where the thickness of the insulating film 50 is increased to, for example, 4 μm or more, it is sufficient to include the insulating particles 1 having a particle size Pd of 50 nm or more to prevent the occurrence of cracks in the insulating film 50. However, in the case where, for example, the hole 52 is formed in the insulating film 50 and the particle size Pd is large, e.g., 50 nm, the size of the voids 2 between the insulating particles 1 becomes large; and the etchant permeates easily. Also, in the case where the hole 52 is patterned in the insulating film 50 using dry etching, roughness occurs from the hole 52 toward the insulating film 50 due to the voids 2 between the insulating particles 1. Therefore, it is difficult to form the hole 52 in the insulating film 50 with high precision. As shown in a range TA in FIG. 7, it is desirable for cracks not to occur in the insulating film 50 even in the case where the particle size Pd is 30 nm or less and the thickness T50 of the insulating film 50 is increased to, for example, 4 μm or more. The upper limit of the thickness T50 of the insulating film 50 is, for example, 7 μm. In one example, the range of the thickness T50 of the insulating film 50 is not less than 4 μm and not more than 7 μm (4 μm≤T50≤7μm).

The insulating film 50 may be multiply stacked. In one example, the range of a thickness TI of the stacked film of the multiply stacked insulating film 50 is, for example, not less than 4 μm and not more than 14 μm (4 μm≤TI≤14 μm). For example, it is favorable to multiply stack the insulating film 50 in the case where it is necessary for the thickness of the insulating film 50 to exceed 7 μm.

In the aforementioned step ST3, the insulating film 50 may be exposed to the atmosphere including a silane compound or a silazane compound instead of the atmosphere including a siloxane compound. For example, the second film 4 may be formed on the surface of the first film 3 by ALD (Atomic Layer Deposition) using a gas including a silane compound or a silazane compound. Such step ST3 (ALD) and step ST4 are repeated multiple times, the voids 2 can be small and a silanol (Si—OH) can be decreased. This improves density of the insulating film 50, strength of the insulating film 50, and resistance to chemicals of the insulating film 50.

According to the insulating film 50 included in the semiconductor device 100 according to the embodiment, for example, the following advantages can be obtained.

(1) The insulating particles 1 are included. Even in the case where the thickness T50 of the insulating film 50 is formed to be a thickness of, for example, 4 μm or more, cracks do not occur easily compared to the case where the insulating particles 1 are not included.

To suppress the cracks, the voids 2 are caused to exist by adjusting the thickness of the first film 3 at the surface of the insulating particle 1. Thereby, the internal stress of the insulating film 50 is relaxed; and the cracks do not occur easily. For example, it is favorable to control the average size of the voids 2 to exceed 0 nm and be not more than 10 nm to maintain good permeation of the chemical liquid (e.g., the etchant) into the insulating film 50 and a good patterned configuration of the insulating film 50 while suppressing the cracks.

(2) The insulating particles 1 include particle sizes Pd of not less than 15 nm and not more than 30 nm. For example, the average particle size of the insulating particles 1 is not less than 15 nm and not more than 30 nm. When forming the hole 52 in the insulating film 50, compared to the case where the average particle size of the insulating particles 1 exceeds 30 nm, the etchant does not permeate easily between the insulating particles 1. The hole 52 can be formed with high precision in the insulating film 50.

(3) The average size of the voids 2 between the insulating particles 1 exceeds 0 nm and is not more than 10 nm. The density of the insulating film 50 is high compared to the case where the average size of the voids 2 exceeds 10 nm. For example, even in the case where the thickness T50 of the insulating film 50 is formed to have a thickness of 4 μm or more, the cracks occur less easily. Moreover, the chemical resistance and polishing resistance also are excellent. For example, excessive polishing of the insulating film 50 in the polishing process shown in FIG. 3F can be suppressed; and excessive etching of the insulating film 50 in the hole-making process shown in FIG. 3G can be suppressed.

For example, in the case where step ST3 (exposure) and step ST4 (baking) shown in FIG. 4 are omitted, the polishing rate of the CMP of the insulating film 50 increases to about 10 times that of the polishing rate of a TEOS film. Conversely, for the insulating film 50 of the embodiment for which step ST3 (exposure) and step ST4 (baking) shown in FIG. 4 are performed, the polishing rate of the CMP is substantially equal to the polishing rate of the TEOS film which is silicon oxide.

(4) The insulating film 50 is the coating-type. Compared to an insulating film formed using CVD, a thick insulating film 50, e.g., even an insulating film 50 having a thickness T50 of, for example, 4 μm or more can be formed in a shorter amount of time. An improvement of the throughput in the manufacture of the semiconductor device also can be realized.

Thus, according to the embodiments, a semiconductor device including an insulating film and a method for manufacturing the semiconductor device are provided so that the occurrence of cracks in the insulating film is suppressible, and the insulating film has excellent hole patternability, chemical resistance, and polishing resistance even in the case where the insulating film is formed to be thick.

Hereinabove, embodiments of the invention are described with reference to specific examples. However, the invention is not limited to these specific examples. For example, one skilled in the art may similarly practice the invention by appropriately selecting specific configurations of the first insulating particle 1a and the second insulating particle 1b from known art; and such practice is within the scope of the invention to the extent that similar effects can be obtained. In particular, it is possible to appropriately modify the elements included in the first insulating particle 1a and the second insulating particle 1b. For example, it is also possible to appropriately modify the baking time and the baking temperature of the baking process shown in FIG. 4.

Although the insulating film 50 is provided between the first portion 61 and the second portion 62 in the embodiment, the insulating film 50 may be used as an insulating film of the semiconductor device 100 in locations other than between the first portion 61 and the second portion 62.

According to the embodiments, a semiconductor device including a practical and thick insulating film in which the occurrence of cracks can be suppressed, and a method for manufacturing the semiconductor device can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising an insulating film, the insulating film including
    a first insulating particle,
    a second insulating particle,
    a first film at a surface of the first insulating particle and at a surface of the second insulating particle, and
    a second film between the surfaces of the first insulating particle and the second insulating particle,
    wherein a ratio of a stretching vibration peak height of Si—OH in Fourier transform infrared spectroscopy (FT-IR) analysis to a stretching vibration peak height of Si—O—Si in the FT-IR analysis for the insulating film is 0% or more, and is not more than 5%.

2. The device according to claim 1, wherein the first insulating particle and the second insulating particle each are inorganic insulating particles.

3. The device according to claim 2, wherein the inorganic insulating particle includes silicon oxide.

4. The device according to claim 2, further comprising the first film at a surface of the inorganic insulating particle, the first film including an organic-inorganic hybrid polymer.

5. The device according to claim 4, wherein the organic-inorganic hybrid polymer includes polysiloxane.

6. The device according to claim 1, further comprising the second film between the first insulating particle and the second insulating particle.

7. The device according to claim 6, wherein the second film includes a siloxane bond.

8. The device according to claim 7, wherein the siloxane bond includes a cyclosiloxane bond.

9. The device according to claim 1, further comprising:
    a base body including a semiconductor layer;
    a first portion including a first semiconductor element and being provided on the base body; and
    a second portion including a second semiconductor element and being provided on the base body, the second semiconductor element being separated from the first semiconductor element in a first direction,
    the insulating film being provided between the first portion and the second portion.

10. The device according to claim 9, wherein a thickness of the insulating film in a second direction is not less than 4 μm and not more than 7 μm, the second direction crossing the first direction.

11. The device according to claim 9, further comprising a conductive body extending in a second direction in the insulating film, the second direction crossing the first direction.

12. The device according to claim 1, wherein a diameter of a spherical shaped particle of at least one of the first insulating particle or the second insulating particle exceeds 0 nm and is not more than 30 nm,
    wherein an average value of a maximum dimension in any direction in a given volume occupied by a void between the first insulating particle and the second insulating particle exceeds 0 nm and is not more than 10 nm.

* * * * *